(12) United States Patent
Saxena et al.

(10) Patent No.: US 10,182,496 B2
(45) Date of Patent: *Jan. 15, 2019

(54) SPANNING TREE PROTOCOL OPTIMIZATION

(71) Applicant: CISCO TECHNOLOGY, INC., San Jose, CA (US)

(72) Inventors: Abhishek Saxena, San Jose, CA (US); Ramana Mellacheruvu, Cupertino, CA (US); Parag Deshpande, San Jose, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/480,286

(22) Filed: Apr. 5, 2017

(65) Prior Publication Data
US 2017/0207961 A1 Jul. 20, 2017

Related U.S. Application Data

(63) Continuation of application No. 14/459,085, filed on Aug. 13, 2014, now Pat. No. 9,655,232.
(Continued)

(51) Int. Cl.
*H04L 12/26* (2006.01)
*H05K 1/02* (2006.01)
(Continued)

(52) U.S. Cl.
CPC .............. *H05K 1/0245* (2013.01); *G06F 1/16* (2013.01); *H04L 41/0803* (2013.01);
(Continued)

(58) Field of Classification Search
CPC ............................ H04L 41/0886; H04L 41/12
See application file for complete search history.

(56) References Cited

U.S. PATENT DOCUMENTS

| 4,298,770 A | 11/1981 | Nishihara et al. |
| 4,636,919 A | 1/1987 | Itakura et al. |

(Continued)

FOREIGN PATENT DOCUMENTS

| WO | WO 03/067799 | 8/2003 |
| WO | WO 2014/071996 | 5/2014 |

OTHER PUBLICATIONS

Aslam, Faisal, et al., "NPP: A Facility Based Computation Framework for Restoration Routing Using Aggregate Link Usage Information," Proceedings of QoS-IP: quality of service in multiservice IP network, Feb. 2005, pp. 150-163.
(Continued)

*Primary Examiner* — Kevin C. Harper
(74) *Attorney, Agent, or Firm* — Polsinelli PC

(57) ABSTRACT

Systems and approaches are provided for optimizing the Spanning Tree Protocol (STP) in a switched network. STP port type for a network infrastructure device can be controlled based on the dynamically discovered neighbor device type of the directly connected peer of the device using the Link Level Discovery Protocol (LLDP). LLDP can provide system capabilities of a link level peer to identify whether the link level peer is a host or a network infrastructure device. In various embodiments, the exchange of system capabilities can the trigger the configuration of an STP port as a network port for ports connected to network infrastructure devices or edge ports for ports directly connected to host devices.

16 Claims, 7 Drawing Sheets

Related U.S. Application Data

(60) Provisional application No. 61/900,378, filed on Nov. 5, 2013.

(51) Int. Cl.

| | | |
|---|---|---|
| *H04L 12/24* | (2006.01) | |
| *H04L 12/753* | (2013.01) | |
| *H04L 12/705* | (2013.01) | |
| *G06F 1/16* | (2006.01) | |
| *H05K 1/11* | (2006.01) | |

(52) U.S. Cl.
CPC ...... *H04L 41/0806* (2013.01); *H04L 41/0876* (2013.01); *H04L 41/12* (2013.01); *H04L 45/18* (2013.01); *H04L 45/48* (2013.01); *H05K 1/0216* (2013.01); *H05K 1/115* (2013.01); *Y02D 30/30* (2018.01)

(56) References Cited

U.S. PATENT DOCUMENTS

| | | | |
|---|---|---|---|
| 4,700,016 A | 10/1987 | Hitchcock et al. | |
| 5,115,431 A | 5/1992 | Williams et al. | |
| 5,801,597 A | 9/1998 | Carter et al. | |
| 5,859,835 A | 1/1999 | Varma et al. | |
| 5,926,458 A | 7/1999 | Yin et al. | |
| 6,252,876 B1 | 6/2001 | Brueckheimer et al. | |
| 6,388,208 B1 | 5/2002 | Kiani et al. | |
| 6,389,031 B1 | 5/2002 | Chao et al. | |
| 6,456,624 B1 | 9/2002 | Eccles et al. | |
| 6,486,405 B2 | 11/2002 | Lin | |
| 6,650,640 B1 | 11/2003 | Muller et al. | |
| 6,677,831 B1 | 1/2004 | Cheng et al. | |
| 6,714,553 B1 | 3/2004 | Poole et al. | |
| 6,757,897 B1 | 6/2004 | Shi et al. | |
| 6,876,952 B1 | 4/2005 | Kappler et al. | |
| 6,907,039 B2 | 6/2005 | Shen | |
| 6,941,649 B2 | 9/2005 | Goergen | |
| 6,952,421 B1 * | 10/2005 | Slater | H04L 45/00 370/401 |
| 6,954,463 B1 | 10/2005 | Ma et al. | |
| 6,996,099 B1 | 2/2006 | Kadambi et al. | |
| 7,002,430 B2 | 2/2006 | Benham et al. | |
| 7,068,667 B2 | 6/2006 | Foster et al. | |
| 7,152,117 B1 | 12/2006 | Stapp et al. | |
| 7,177,946 B1 | 2/2007 | Kaluve et al. | |
| 7,232,959 B2 | 6/2007 | Hsu | |
| 7,249,337 B2 | 7/2007 | Gisin et al. | |
| 7,372,857 B1 | 5/2008 | Kappler et al. | |
| 7,397,320 B1 | 7/2008 | Bokhari | |
| 7,411,915 B1 * | 8/2008 | Spain | H04L 41/0806 370/250 |
| 7,426,604 B1 | 9/2008 | Rygh et al. | |
| 7,448,880 B2 | 11/2008 | Osaka | |
| 7,516,211 B1 * | 4/2009 | Gourlay | H04L 41/0816 370/356 |
| 7,539,131 B2 | 5/2009 | Shen | |
| 7,580,409 B1 | 8/2009 | Swenson et al. | |
| 7,630,368 B2 | 12/2009 | Tripathi et al. | |
| 7,729,296 B1 * | 6/2010 | Choudhary | H04L 12/4625 370/256 |
| 7,826,400 B2 | 11/2010 | Sakauchi | |
| 7,826,469 B1 | 11/2010 | Li et al. | |
| 7,848,340 B2 | 12/2010 | Sakauchi et al. | |
| 8,233,384 B2 | 7/2012 | Osterhout et al. | |
| 8,283,991 B1 | 10/2012 | Essenwanger | |
| 8,302,301 B2 | 11/2012 | Lau | |
| 8,325,459 B2 | 12/2012 | Mutnury et al. | |
| 8,339,973 B1 | 12/2012 | Pichumani et al. | |
| 8,378,223 B1 | 2/2013 | Shiue et al. | |
| 8,442,063 B1 | 5/2013 | Zhou et al. | |
| 8,514,712 B1 * | 8/2013 | Aswadhati | H04L 12/6418 370/235 |
| 8,624,688 B2 | 1/2014 | Essenwanger | |
| 8,687,629 B1 | 4/2014 | Kompella et al. | |
| 8,854,972 B1 | 10/2014 | Li | |
| 8,868,766 B1 | 10/2014 | Theimer et al. | |
| 8,908,691 B2 | 12/2014 | Biswas et al. | |
| 9,036,481 B1 | 5/2015 | White | |
| 9,106,508 B2 | 8/2015 | Banavalikar et al. | |
| 9,178,715 B2 | 11/2015 | Jain et al. | |
| 9,197,551 B2 | 11/2015 | DeCusatis et al. | |
| 9,203,188 B1 | 12/2015 | Siechen et al. | |
| 9,245,626 B2 | 1/2016 | Fingerhut et al. | |
| 9,258,195 B1 | 2/2016 | Pendleton et al. | |
| 9,325,524 B2 | 4/2016 | Banavalikar et al. | |
| 9,374,294 B1 | 6/2016 | Pani | |
| 9,402,470 B2 | 8/2016 | Shen et al. | |
| 9,407,501 B2 | 8/2016 | Yadav et al. | |
| 9,426,060 B2 | 8/2016 | Dixon et al. | |
| 9,433,081 B1 | 8/2016 | Xiong et al. | |
| 9,444,634 B2 | 9/2016 | Pani | |
| 9,502,111 B2 | 11/2016 | Dharmapurikar et al. | |
| 9,509,092 B2 | 11/2016 | Shen et al. | |
| 9,544,185 B1 | 1/2017 | Yadav et al. | |
| 9,544,224 B2 | 1/2017 | Chu et al. | |
| 9,590,914 B2 | 3/2017 | Attar et al. | |
| 9,627,063 B2 | 4/2017 | Dharmapurikar et al. | |
| 9,634,846 B2 | 4/2017 | Pani | |
| 9,635,937 B2 | 5/2017 | Shen et al. | |
| 9,654,300 B2 | 5/2017 | Pani | |
| 9,654,385 B2 | 5/2017 | Chu et al. | |
| 9,654,409 B2 | 5/2017 | Yadav et al. | |
| 9,655,232 B2 * | 5/2017 | Saxena | H04L 41/0803 |
| 9,667,431 B2 | 5/2017 | Pani | |
| 9,667,551 B2 | 5/2017 | Edsall et al. | |
| 9,674,086 B2 | 6/2017 | Ma et al. | |
| 9,686,180 B2 | 6/2017 | Chu et al. | |
| 9,698,994 B2 | 7/2017 | Pani | |
| 9,716,665 B2 | 7/2017 | Attar et al. | |
| 9,742,673 B2 | 8/2017 | Banerjee et al. | |
| 9,755,965 B1 | 9/2017 | Yadav et al. | |
| 9,769,078 B2 | 9/2017 | Attar et al. | |
| 9,876,715 B2 | 1/2018 | Edsall et al. | |
| 2002/0126671 A1 | 9/2002 | Ellis et al. | |
| 2002/0136268 A1 | 9/2002 | Gan et al. | |
| 2002/0146026 A1 | 10/2002 | Unitt et al. | |
| 2003/0035385 A1 | 2/2003 | Walsh et al. | |
| 2003/0058837 A1 | 3/2003 | Denney et al. | |
| 2003/0058860 A1 | 3/2003 | Kunze et al. | |
| 2003/0067912 A1 | 4/2003 | Mead et al. | |
| 2003/0067924 A1 | 4/2003 | Choe et al. | |
| 2003/0097461 A1 | 5/2003 | Barham et al. | |
| 2003/0115319 A1 | 6/2003 | Dawson et al. | |
| 2003/0120884 A1 | 6/2003 | Koob et al. | |
| 2003/0137940 A1 | 7/2003 | Schwartz et al. | |
| 2003/0142629 A1 | 7/2003 | Krishnamurthi et al. | |
| 2003/0174650 A1 | 9/2003 | Shankar et al. | |
| 2003/0223376 A1 | 12/2003 | Elliott et al. | |
| 2003/0231646 A1 | 12/2003 | Chandra et al. | |
| 2004/0031030 A1 | 2/2004 | Kidder et al. | |
| 2004/0062259 A1 | 4/2004 | Jeffries et al. | |
| 2004/0073715 A1 | 4/2004 | Folkes et al. | |
| 2004/0100901 A1 | 5/2004 | Bellows | |
| 2004/0103310 A1 | 5/2004 | Sobel et al. | |
| 2004/0111507 A1 | 6/2004 | Villado et al. | |
| 2004/0160956 A1 | 8/2004 | Hardy et al. | |
| 2004/0249960 A1 | 12/2004 | Hardy et al. | |
| 2005/0007961 A1 | 1/2005 | Scott et al. | |
| 2005/0010685 A1 | 1/2005 | Ramnath et al. | |
| 2005/0013143 A1 | 1/2005 | Buddhikot et al. | |
| 2005/0073958 A1 | 4/2005 | Atlas et al. | |
| 2005/0083835 A1 | 4/2005 | Prairie et al. | |
| 2005/0091239 A1 | 4/2005 | Ward et al. | |
| 2005/0117593 A1 | 6/2005 | Shand | |
| 2005/0175020 A1 | 8/2005 | Park et al. | |
| 2005/0201375 A1 | 9/2005 | Komatsu et al. | |
| 2005/0207410 A1 | 9/2005 | Adhikari et al. | |
| 2005/0213504 A1 | 9/2005 | Enomoto et al. | |
| 2005/0232227 A1 | 10/2005 | Jorgenson et al. | |
| 2005/0240745 A1 | 10/2005 | Iyer et al. | |
| 2006/0013143 A1 | 1/2006 | Yasuie et al. | |
| 2006/0028285 A1 | 2/2006 | Jang et al. | |

(56) References Cited

U.S. PATENT DOCUMENTS

| | | |
|---|---|---|
| 2006/0031643 A1 | 2/2006 | Figueira |
| 2006/0039364 A1 | 2/2006 | Wright |
| 2006/0072461 A1 | 4/2006 | Luong et al. |
| 2006/0075093 A1 | 4/2006 | Frattura et al. |
| 2006/0083179 A1 | 4/2006 | Mitchell |
| 2006/0083256 A1 | 4/2006 | Mitchell |
| 2006/0182036 A1 | 8/2006 | Sasagawa et al. |
| 2006/0193332 A1 | 8/2006 | Qian et al. |
| 2006/0198315 A1 | 9/2006 | Sasagawa et al. |
| 2006/0209688 A1 | 9/2006 | Tsuge et al. |
| 2006/0209702 A1 | 9/2006 | Schmitt et al. |
| 2006/0215572 A1 | 9/2006 | Padhye et al. |
| 2006/0215623 A1 | 9/2006 | Lin et al. |
| 2006/0221835 A1 | 10/2006 | Sweeney |
| 2006/0221950 A1 | 10/2006 | Heer |
| 2006/0227790 A1 | 10/2006 | Yeung et al. |
| 2006/0239204 A1 | 10/2006 | Bordonaro et al. |
| 2006/0250982 A1 | 11/2006 | Yuan et al. |
| 2006/0268742 A1 | 11/2006 | Chu et al. |
| 2006/0274647 A1 | 12/2006 | Wang et al. |
| 2006/0274657 A1 | 12/2006 | Olgaard et al. |
| 2006/0280179 A1 | 12/2006 | Meier |
| 2006/0285500 A1 | 12/2006 | Booth, III et al. |
| 2007/0016590 A1 | 1/2007 | Appleby et al. |
| 2007/0025241 A1 | 2/2007 | Nadeau et al. |
| 2007/0047463 A1 | 3/2007 | Jarvis et al. |
| 2007/0053303 A1 | 3/2007 | Kryuchkov |
| 2007/0058557 A1 | 3/2007 | Cuffaro et al. |
| 2007/0061451 A1 | 3/2007 | Villado et al. |
| 2007/0076605 A1 | 4/2007 | Cidon et al. |
| 2007/0091795 A1 | 4/2007 | Bonaventure et al. |
| 2007/0097872 A1 | 5/2007 | Chiu |
| 2007/0159987 A1* | 7/2007 | Khan ............... H04L 45/00 370/256 |
| 2007/0160073 A1 | 7/2007 | Toumura et al. |
| 2007/0165515 A1 | 7/2007 | Vasseur |
| 2007/0171814 A1 | 7/2007 | Florit et al. |
| 2007/0177525 A1 | 8/2007 | Wijnands et al. |
| 2007/0183337 A1 | 8/2007 | Cashman et al. |
| 2007/0211625 A1 | 9/2007 | Liu et al. |
| 2007/0217415 A1 | 9/2007 | Wijnands et al. |
| 2007/0223372 A1 | 9/2007 | Haalen et al. |
| 2007/0233847 A1 | 10/2007 | Aldereguia et al. |
| 2007/0258382 A1 | 11/2007 | Foll et al. |
| 2007/0258383 A1 | 11/2007 | Wada |
| 2007/0274229 A1 | 11/2007 | Scholl et al. |
| 2007/0280264 A1 | 12/2007 | Milton et al. |
| 2008/0031130 A1 | 2/2008 | Raj et al. |
| 2008/0031146 A1 | 2/2008 | Kwak et al. |
| 2008/0031247 A1 | 2/2008 | Tahara et al. |
| 2008/0092213 A1 | 4/2008 | Wei et al. |
| 2008/0123559 A1 | 5/2008 | Haviv et al. |
| 2008/0147830 A1 | 6/2008 | Ridgill et al. |
| 2008/0151863 A1 | 6/2008 | Lawrence et al. |
| 2008/0177896 A1 | 7/2008 | Quinn et al. |
| 2008/0212496 A1 | 9/2008 | Zou |
| 2008/0219173 A1 | 9/2008 | Yoshida et al. |
| 2008/0225853 A1 | 9/2008 | Melman et al. |
| 2008/0259809 A1 | 10/2008 | Stephan et al. |
| 2008/0259925 A1 | 10/2008 | Droms et al. |
| 2008/0310421 A1* | 12/2008 | Teisberg ............ H04L 12/4641 370/395.53 |
| 2009/0052332 A1 | 2/2009 | Fukuyama et al. |
| 2009/0067322 A1 | 3/2009 | Shand et al. |
| 2009/0094357 A1 | 4/2009 | Keohane et al. |
| 2009/0103566 A1 | 4/2009 | Kloth et al. |
| 2009/0116402 A1 | 5/2009 | Yamasaki |
| 2009/0122805 A1 | 5/2009 | Epps et al. |
| 2009/0161567 A1 | 6/2009 | Jayawardena et al. |
| 2009/0188711 A1 | 7/2009 | Ahmad |
| 2009/0193103 A1 | 7/2009 | Small et al. |
| 2009/0225671 A1 | 9/2009 | Arbel et al. |
| 2009/0232011 A1 | 9/2009 | Li et al. |
| 2009/0238196 A1 | 9/2009 | Ukita et al. |
| 2009/0268614 A1 | 10/2009 | Tay et al. |
| 2009/0271508 A1 | 10/2009 | Sommers et al. |
| 2010/0020719 A1 | 1/2010 | Chu et al. |
| 2010/0020726 A1 | 1/2010 | Chu et al. |
| 2010/0128619 A1 | 5/2010 | Shigei |
| 2010/0150155 A1 | 6/2010 | Napierala |
| 2010/0161787 A1 | 6/2010 | Jones |
| 2010/0189080 A1 | 7/2010 | Hu et al. |
| 2010/0191813 A1 | 7/2010 | Gandhewar et al. |
| 2010/0191839 A1 | 7/2010 | Gandhewar et al. |
| 2010/0223655 A1 | 9/2010 | Zheng |
| 2010/0260197 A1 | 10/2010 | Martin et al. |
| 2010/0287227 A1 | 11/2010 | Goel et al. |
| 2010/0299553 A1 | 11/2010 | Cen |
| 2010/0312875 A1 | 12/2010 | Wilerson et al. |
| 2011/0022725 A1 | 1/2011 | Farkas |
| 2011/0110241 A1 | 5/2011 | Atkinson et al. |
| 2011/0110587 A1 | 5/2011 | Banner |
| 2011/0138310 A1 | 6/2011 | Gomez et al. |
| 2011/0158248 A1 | 6/2011 | Vorunganti et al. |
| 2011/0170426 A1 | 7/2011 | Kompella et al. |
| 2011/0199891 A1 | 8/2011 | Chen |
| 2011/0199941 A1 | 8/2011 | Ouellette et al. |
| 2011/0203834 A1 | 8/2011 | Yoneya et al. |
| 2011/0203843 A1 | 8/2011 | Kushita |
| 2011/0228795 A1 | 9/2011 | Agrawal et al. |
| 2011/0239189 A1 | 9/2011 | Attalla |
| 2011/0243136 A1 | 10/2011 | Raman et al. |
| 2011/0249682 A1 | 10/2011 | Kean et al. |
| 2011/0268118 A1 | 11/2011 | Schlansker et al. |
| 2011/0273987 A1 | 11/2011 | Schlansker et al. |
| 2011/0280572 A1 | 11/2011 | Vobbilisetty et al. |
| 2011/0286447 A1 | 11/2011 | Liu |
| 2011/0299406 A1 | 12/2011 | Vobbilisetty et al. |
| 2011/0310738 A1 | 12/2011 | Lee et al. |
| 2011/0321031 A1 | 12/2011 | Dournov et al. |
| 2012/0007688 A1 | 1/2012 | Zhou et al. |
| 2012/0030150 A1 | 2/2012 | McAuley et al. |
| 2012/0030666 A1 | 2/2012 | Laicher et al. |
| 2012/0057505 A1 | 3/2012 | Xue |
| 2012/0063318 A1 | 3/2012 | Boddu et al. |
| 2012/0102114 A1 | 4/2012 | Dunn et al. |
| 2012/0147752 A1 | 6/2012 | Ashwood-Smith et al. |
| 2012/0163396 A1 | 6/2012 | Cheng et al. |
| 2012/0167013 A1 | 6/2012 | Kaiser et al. |
| 2012/0195233 A1 | 8/2012 | Wang et al. |
| 2012/0275304 A1 | 11/2012 | Patel et al. |
| 2012/0281697 A1 | 11/2012 | Huang |
| 2012/0300669 A1 | 11/2012 | Zahavi |
| 2012/0300787 A1 | 11/2012 | Korger |
| 2012/0314581 A1 | 12/2012 | Rajamanickam et al. |
| 2013/0055155 A1 | 2/2013 | Wong et al. |
| 2013/0064246 A1 | 3/2013 | Dharmapurikar et al. |
| 2013/0090014 A1 | 4/2013 | Champion |
| 2013/0097335 A1 | 4/2013 | Jiang et al. |
| 2013/0124708 A1 | 5/2013 | Lee et al. |
| 2013/0151681 A1 | 6/2013 | Dournov et al. |
| 2013/0162364 A1 | 6/2013 | Lin |
| 2013/0182712 A1 | 7/2013 | Aguayo et al. |
| 2013/0208624 A1 | 8/2013 | Ashwood-Smith |
| 2013/0223276 A1 | 8/2013 | Padgett |
| 2013/0227108 A1 | 8/2013 | Dunbar et al. |
| 2013/0227689 A1 | 8/2013 | Pietrowicz et al. |
| 2013/0250779 A1 | 9/2013 | Meloche et al. |
| 2013/0250951 A1 | 9/2013 | Koganti |
| 2013/0276129 A1 | 10/2013 | Nelson et al. |
| 2013/0311663 A1 | 11/2013 | Kamath et al. |
| 2013/0311991 A1 | 11/2013 | Li et al. |
| 2013/0322258 A1 | 12/2013 | Nedeltchev et al. |
| 2013/0322446 A1 | 12/2013 | Biswas et al. |
| 2013/0322453 A1 | 12/2013 | Allan |
| 2013/0329605 A1 | 12/2013 | Nakil et al. |
| 2013/0332399 A1 | 12/2013 | Reddy et al. |
| 2013/0332577 A1 | 12/2013 | Nakil et al. |
| 2013/0332602 A1 | 12/2013 | Nakil et al. |
| 2014/0006549 A1 | 1/2014 | Narayanaswamy et al. |
| 2014/0016501 A1 | 1/2014 | Kamath et al. |
| 2014/0043535 A1 | 2/2014 | Motoyama et al. |
| 2014/0043972 A1 | 2/2014 | Li et al. |
| 2014/0047264 A1 | 2/2014 | Wang et al. |

(56) References Cited

U.S. PATENT DOCUMENTS

| | | |
|---|---|---|
| 2014/0050223 A1 | 2/2014 | Foo et al. |
| 2014/0056298 A1 | 2/2014 | Vobbilisetty et al. |
| 2014/0064281 A1 | 3/2014 | Basso et al. |
| 2014/0068750 A1 | 3/2014 | Tjahjono et al. |
| 2014/0086097 A1 | 3/2014 | Qu et al. |
| 2014/0086253 A1 | 3/2014 | Yong et al. |
| 2014/0105039 A1 | 4/2014 | Mcdysan |
| 2014/0105062 A1 | 4/2014 | Mcdysan et al. |
| 2014/0105216 A1 | 4/2014 | Mcdysan |
| 2014/0108489 A1 | 4/2014 | Glines et al. |
| 2014/0146817 A1 | 5/2014 | Zhang |
| 2014/0146824 A1 | 5/2014 | Angst et al. |
| 2014/0149819 A1 | 5/2014 | Lu et al. |
| 2014/0185348 A1 | 7/2014 | Vattikonda et al. |
| 2014/0185349 A1 | 7/2014 | Terzioglu et al. |
| 2014/0201375 A1 | 7/2014 | Beereddy et al. |
| 2014/0219275 A1 | 8/2014 | Allan et al. |
| 2014/0236512 A1 | 8/2014 | Yan |
| 2014/0241353 A1 | 8/2014 | Zhang et al. |
| 2014/0244779 A1 | 8/2014 | Roitshtein et al. |
| 2014/0269705 A1 | 9/2014 | DeCusatis et al. |
| 2014/0269712 A1 | 9/2014 | Kidambi |
| 2014/0307744 A1 | 10/2014 | Dunbar et al. |
| 2014/0321277 A1 | 10/2014 | Lynn, Jr. et al. |
| 2014/0328206 A1 | 11/2014 | Chan et al. |
| 2014/0334295 A1 | 11/2014 | Guichard et al. |
| 2014/0341029 A1 | 11/2014 | Allan et al. |
| 2014/0372582 A1 | 12/2014 | Ghanwani et al. |
| 2015/0009992 A1 | 1/2015 | Zhang |
| 2015/0010001 A1 | 1/2015 | Duda et al. |
| 2015/0016277 A1 | 1/2015 | Smith et al. |
| 2015/0052298 A1 | 2/2015 | Brand et al. |
| 2015/0092551 A1 | 4/2015 | Moisand et al. |
| 2015/0092593 A1 | 4/2015 | Kompella |
| 2015/0113143 A1 | 4/2015 | Stuart et al. |
| 2015/0124629 A1 | 5/2015 | Pani |
| 2015/0124631 A1 | 5/2015 | Edsall et al. |
| 2015/0124633 A1 | 5/2015 | Banerjee et al. |
| 2015/0124640 A1 | 5/2015 | Chu et al. |
| 2015/0124644 A1 | 5/2015 | Pani |
| 2015/0124806 A1 | 5/2015 | Banerjee et al. |
| 2015/0124817 A1 | 5/2015 | Merchant et al. |
| 2015/0124821 A1 | 5/2015 | Chu et al. |
| 2015/0124823 A1 | 5/2015 | Pani et al. |
| 2015/0124824 A1 | 5/2015 | Edsall et al. |
| 2015/0124825 A1 | 5/2015 | Dharmapurikar et al. |
| 2015/0124833 A1 | 5/2015 | Ma et al. |
| 2015/0127797 A1 | 5/2015 | Attar et al. |
| 2015/0188771 A1 | 7/2015 | Allan et al. |
| 2015/0236900 A1 | 8/2015 | Chung |
| 2015/0378712 A1 | 12/2015 | Cameron et al. |
| 2015/0378969 A1 | 12/2015 | Powell et al. |
| 2016/0036697 A1 | 2/2016 | DeCusatis et al. |
| 2016/0119204 A1 | 4/2016 | Murasato et al. |
| 2016/0315811 A1 | 10/2016 | Yadav et al. |
| 2017/0085469 A1 | 3/2017 | Chu et al. |
| 2017/0214619 A1 | 7/2017 | Chu et al. |
| 2017/0237651 A1 | 8/2017 | Pani |
| 2017/0237678 A1 | 8/2017 | Ma et al. |
| 2017/0250912 A1 | 8/2017 | Chu et al. |
| 2017/0346748 A1 | 11/2017 | Attar et al. |

OTHER PUBLICATIONS

Chandy, K. Mani, et al., "Distribution Snapshots: Determining Global States of Distributed Systems," ACM Transaction on Computer Systems, Feb. 1985, vol. 3, No. 1, pp. 63-75.

Khasnabish, Bhumip, et al., "Mobility and Interconnection of Virtual Machines and Virtual Network Elements; draft-khasnabish-vmmi-problems-03.txt," Network Working Group, Dec. 30, 2012, pp. 1-29.

Kodialam, Murali, et. al, "Dynamic Routing of Locally Restorable Bandwidth Guaranteed Tunnels using Aggregated Link Usage Information," Proceedings of IEEE INFOCOM, 2001, vol. 1, pp. 376-385.

Li, Li, et. al, "Routing Bandwidth Guaranteed Paths with Local Restoration in Label Switched Networks," IEEE Journal on Selected Areas in Communications, Feb. 7, 2005, vol. 23, No. 2, pp. 1-11.

Mahalingam, M., et al. "VXLAN: A Framework for Overlaying Virtualized Layer 2 Networks over Layer 3 Networks," VXLAN, Internet Engineering Task Force, Internet Draft, located at https://tools.ietf.org/html/draft-mahalingam-dutt-dcops-vxlan-06, Oct. 2013, pp. 1-24.

Moncaster, T., et al., "The Need for Congestion Exposure in the Internet", Oct. 26, 2009, Internet-Draft, pp. 1-22.

Narten, T., et al., "Problem Statement: Overlays for Network Virtualization," draft-ietf-nvo3-overlay-problem-statement-04, Internet Engineering Task Force, Jul. 31, 2013, pp. 1-24.

Pan, P., et. al, "Fast Reroute Extensions to RSVP-TE for LSP Tunnels," RFC-4090. May 2005, pp. 1-38.

Raza, Saqib, et al., "Online Routing of Bandwidth Guaranteed Paths with Local Restoration using Optimized Aggregate Usage Information," IEEE-ICC '05 Communications, May 2005, vol. 1, 8 pages.

Sinha, Shan, et al., "Harnessing TCP's Burstiness with Flowlet Switching," Nov. 2004, 6 pages.

Author Unknown, "Subset—Wikipedia, the free encyclopedia," Dec. 25, 2014, pp. 1-3.

Whitaker et al., "Forwarding Without Loops in Icarus," IEEE OPENARCH 2002, pp. 63-75.

Zhang, Junjie, et al., "Optimizing Network Performance using Weighted Multipath Routing," Aug. 27, 2012, 7 pages.

* cited by examiner

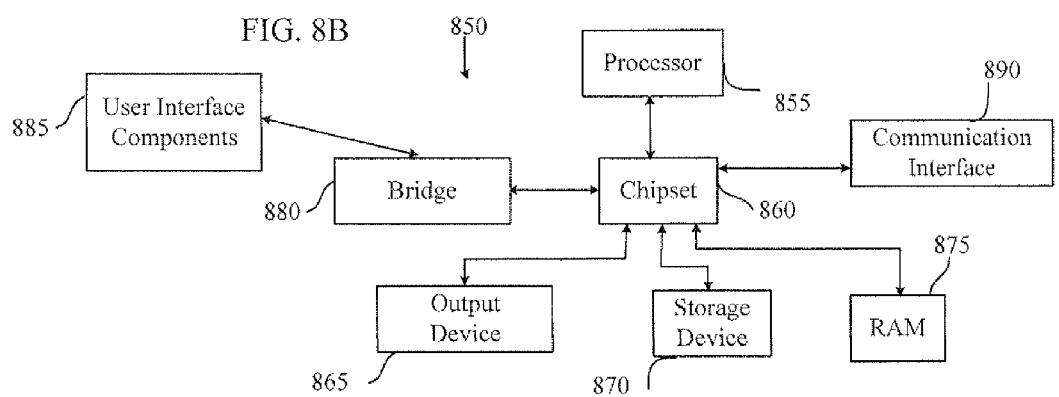
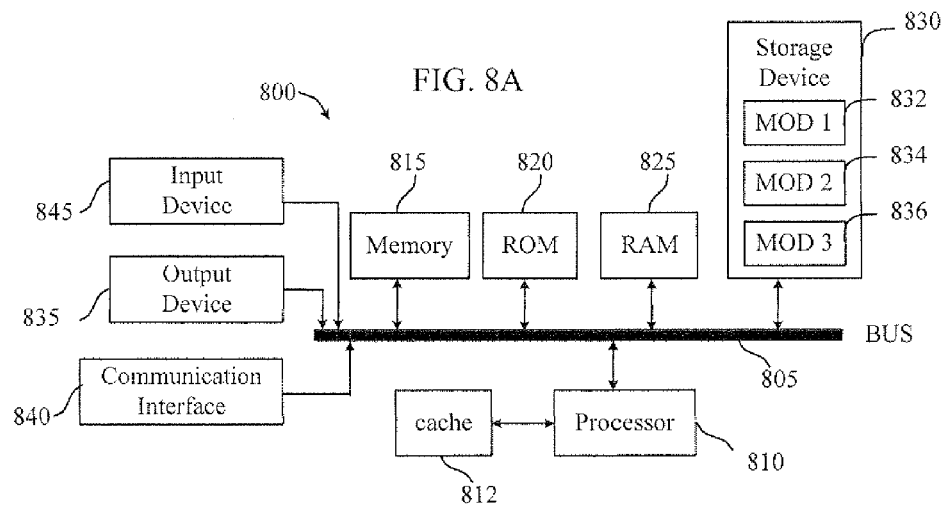

900

---

902

System Capabilities Information from a Link Level Peer is Received.

---

904

A Device Type of Link Level Peer is Determined.

---

906

A STP Port Type is Configured for the Port Based on the Determined Device Type.

FIG. 9

SPANNING TREE PROTOCOL OPTIMIZATION

RELATED APPLICATIONS

This application is a Continuation of U.S. patent application Ser. No. 14/459,085, entitled "SPANNING TREE PROTOCOL (STP) OPTIMIZATION TECHNIQUES", filed on Aug. 13, 2014, which claims priority to U.S. Provisional Patent Application No. 61/900,378, filed Nov. 5, 2013, both of which are incorporated herein by reference in their entirety.

TECHNICAL FIELD

The present technology pertains to computer networking management, and more specifically pertains to the Spanning Tree Protocol (STP) in a switched network.

BACKGROUND

Spanning Tree Protocol (STP) is a link management protocol that can provide path redundancy while preventing loops in a network. For a conventional network, such as an Ethernet network, only one active path can exist between any two nodes for the network to function properly. If a loop were to form in the network, the amount of traffic that could be passed between infrastructure devices (e.g., switches, bridges, relays, among others) can quickly utilize the entire bandwidth available within each of the devices affected.

STP is compliant with IEEE 802.1D, entitled "Media Access Control (MAC) Bridges," and which is incorporated herein by reference. STP can use a Spanning-Tree Algorithm (STA) to calculate an optimal loop-free path throughout a switched network by defining a tree with a root bridge and a loop-free path from the root to all infrastructure devices in the network. STP can force redundant data paths into a standby (blocked) state to create redundancy but not loops. If a network segment in the spanning tree fails and a redundant path exists, the STA can recalculate the spanning tree topology and activate the standby path. Infrastructure devices send and receive STP frames, called bridge protocol data units (BDPUs), at regular intervals. The devices do not forward these frames, but can use the frames to construct a loop-free path.

When two interfaces on a bridge are part of a loop, the STP port priority and path cost settings can determine which interface is put in the forwarding state and which is put in the blocking state. The port priority value can represent the location of an interface in the network topology and how well it is located to pass traffic. The STP path cost value can represent media speed.

The amount of computing resources utilized by STP, such as CPU, memory, and input/output (I/O), can be generally proportional to the product of the number of ports and the number of virtual LANs (VLANs) enabled on each port. With the proliferation of high port density switches (e.g., layer 2 (L2) and layer 3 (L3) switches) and Virtual Ethernet Port Aggregator (VEPA) devices that enable each switch front panel port to be virtualized into many more customer usable physical ports, new systems and approaches are required to optimize STP to keep a network operating system scalable and efficient.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which:

FIG. 8A illustrates a block diagram of a network device in accordance with an exemplary embodiment;

FIG. 8B illustrates a block diagram of a computer system having a chipset architecture that can be used in executing the described method in accordance with an exemplary embodiment; and FIG. 9 illustrates a flowchart for executing an optimized STP configuration in accordance with an exemplary embodiment is illustrated.

OVERVIEW

Figure 1:
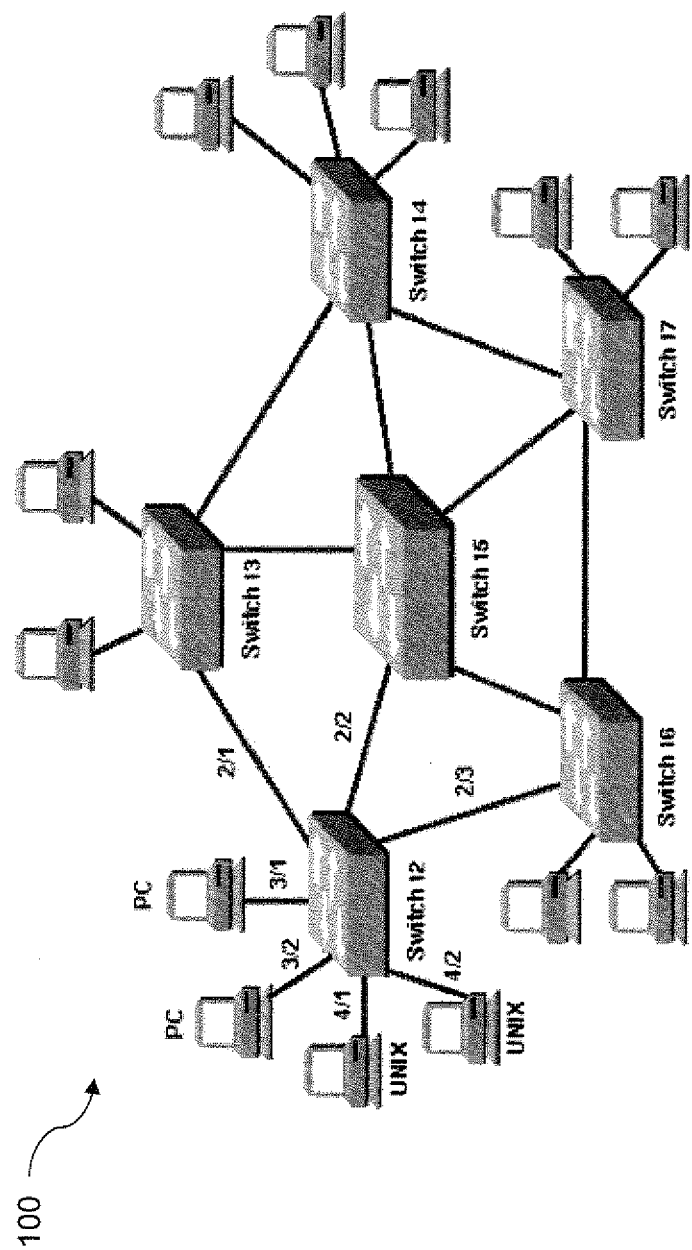
FIG. 1 illustrates a block diagram of a network having a plurality of switches in accordance with an exemplary embodiment.

Various embodiments of the disclosure are discussed in detail below. While specific implementations are discussed, it should be understood that this is done for illustration purposes only. A person skilled in the relevant art will recognize that other components and configurations may be used without parting from the spirit and scope of the disclosure.

Aspects of the technology encompass methods for automatically configuring a network infrastructure device, based on discovered system capabilities of a network peer. In some embodiments, a method of the technology can include steps for receiving system capabilities information from a network peer of the network infrastructure device, determining a device type of the network-peer based on the system capabilities information, and automatically configuring a port of the network infrastructure device based on the determined device type of the network peer.

DESCRIPTION

Disclosed are system, methods and non-transitory computer-readable storage media for optimizing the Spanning Tree Protocol (STP) in a switched network. STP port type can include "edge" or "network" ports. Edge ports are connected directly to hosts while network ports are connected to other network infrastructure devices, such as bridges, switches, relays, components thereof, among others. As edge ports are connected to host devices, edge ports may not need the full STP state machine required by network ports. For example, edge ports can be placed in a forwarding state without running through the entire STP state machine. In addition, the periodic BDPUs transmitted during operation of STP may not need to be sent to edge ports, which can further reduce resource utilization on the system. In various embodiments, STP port type for a network infrastructure device can be controlled based on the dynamically discovered neighbor device type of the directly connected (network) peer of the device using the Link Level Discovery Protocol (LLDP). LLDP can provide system capabilities of a link level peer to identify whether the link level peer is a host or a network infrastructure device. In various embodiments, the exchange of system capabilities can serve as a trigger to configure an STP port as a network port for ports connected to network infrastructure devices or edge ports for ports directly connected to host devices.

The amount of computing resources utilized by STP, such as CPU, memory, and input/output (I/O), can be generally proportional to the product of the number of ports and the number of virtual LANs (VLANs) enabled on each port. With the proliferation of high port density switches (e.g., layer 2 (L2) and layer 3 (L3) switches) and Virtual Ethernet Port Aggregator (VEPA) devices that enable each switch front panel port to be virtualized into many more customer usable physical ports, new systems and approaches are required to optimize STP to keep a network operating system scalable and efficient. In addition, the need to properly configure those ports is also increasing. The disclosed technology addresses the need in the art for reducing the overhead associated with utilizing STP. By optimizing the STP process, ports can be dynamically set by discovering the directly coupled neighboring device and controlling the setting of the STP port type which can reduce resource utilization on the system.

Referring to FIG. 1, a block diagram of a network having a plurality of switches in accordance with an exemplary embodiment is illustrated. As shown, the network can include a switch 15 which can be a backbone switch. Switches 12, 13, 14, 16, and 17 can be switches that attach to workstations and PCs, as well as other network infrastructure devices. In this example, switch 12 includes port 2/1, which connects to switch 13; port 2/2, which connects to switch 15, port 2/3, which connects to switch 16; ports 3/1 and 3/2, which connect to personal computers (PCs); and ports 4/1 and 4/2, which connect to UNIX® workstations.

STP can run on network infrastructure devices that are 802.1D-compliant. STP can be implemented on such devices in order to prevent loops in the network. STP can be used in situations where redundant links, but not loops, are desirable. Redundant links can be important as backups in the case of a failover in a network. A failure of a primary activates the backup links so that users can continue to utilize the network. Without STP operating on the bridges and switches, such a failure can result in a loop.

Figure 2:
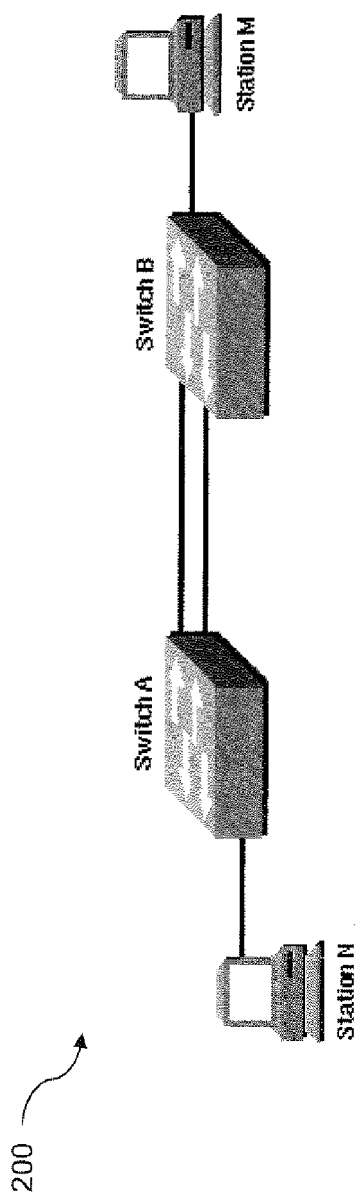
FIG. 2 illustrates is a block diagram of a conventional network in accordance with an exemplary embodiment.

Referring to FIG. 2, a block diagram of a conventional network in accordance with an exemplary embodiment is illustrated. As shown, the network 200 can include a redundant link between Switch A and Switch B. However, this setup can create the possibility of a bridging loop. For example, a broadcast or multicast packet that transmits from Station M and is destined for Station N may continue circulating between both switches.

Figure 3:
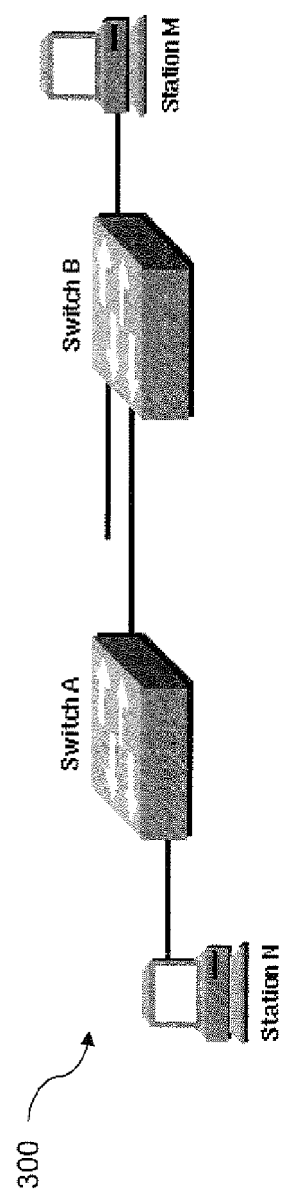
FIG. 3 illustrates a block diagram of the network illustrated in FIG. 2 and implementing STP in accordance with an exemplary embodiment.

Referring to FIG. 3, a block diagram of the network illustrated in FIG. 2 and implementing STP in accordance with an exemplary embodiment is illustrated. As shown, network 300 can have a similar configuration as network 200. However, STP can run on both Switch A and Switch B in the network 300 such that the network 300 operates logically as depicted in FIG. 3, i.e., without a loop condition.

In order to provide desired path redundancy, as well as to avoid a loop condition, STP can define a tree that spans all the switches in an extended network. STP can force certain redundant data paths into a standby (blocked) state and leave other paths in a forwarding state. If a link in the forwarding state becomes unavailable, STP can reconfigure the network and reroutes data paths through the activation of the appropriate standby path. In STP, the switches in a network can elect a root bridge that becomes the focal point in the network. Other decisions in the network, such as which port to block and which port to put in forwarding mode, can also be made from the perspective of this root bridge. A switched environment, which can be different from a bridge environment, may deal with multiple VLANs. When a root bridge is implemented in a switching network, the root bridge can be referred to as the root switch. Each VLAN can be required to have its own root bridge because each VLAN can be a separate broadcast domain. The roots for the different VLANs can all reside in a single switch or in various switches.

The switches in the network can exchange information for use in the root switch selection and for subsequent configuration of the network. Bridge protocol data units (BPDUs) can carry this information. A switch can compare the parameters in the BPDU that the switch sends to a neighbor with the parameters in the BPDU that the switch receives from the neighbor. When the switches first come up, the switches can start the root switch selection process. Each switch can transmit a BPDU to the directly connected switch on a per-VLAN basis. As the BPDU goes out through the network, each switch can compare the BPDU that the switch sends to the BPDU that the switch receives from the neighbors. The switches can then agree on which switch is the root switch. The switch with the lowest bridge ID in the network wins this election process. In other embodiments, other election processes can be employed, e.g., highest bridge ID. After identifying or electing the root switch, the switches generally adhere to these rules:

STP Rule 1—All ports of the root switch are set to forwarding mode. Next, each switch determines the best path to get to the root. The switches determine this path by a comparison of the information in all the BPDUs that the switches receive on all ports. The switch can use the port with the least amount of information in the BPDU in order to get to the root switch. The port with the least amount of information in the BPDU can be the root port. After a switch determines the root port, the switch can proceed to rule 2.

STP Rule 2—The root port is set to forwarding mode. In addition, the switches on each LAN segment can communicate with each other to determine which switch is best to use in order to move data from that segment to the root bridge. This switch can be called the designated switch.

STP Rule 3—In a single LAN segment, the port of the designated switch that connects to that LAN segment is placed in forwarding mode.

STP Rule 4—All the other ports in all the switches (VLAN-specific) are placed in blocking mode. The rule only applies to ports that connect to other bridges or switches. STP does not affect ports that connect to workstations or PCs. These ports can remain forwarded.

STP can calculate the path cost based on the media speed (bandwidth) of the links between switches and the port cost of each port forwarding frame. Spanning tree selects the root port based on the path cost. The port with the lowest path cost to the root bridge can become the root port. The root port is always in the forwarding state. If the speed/duplex of the port is changed, the STP can recalculate the path cost automatically. A change in the path cost can change the spanning tree topology.

As mentioned, data centers are increasingly deploying high port density L2 and L3 switches in their networking infrastructure. Further, many data centers are integrating more and more Virtual Ethernet Port Aggregator (VEPA) devices into their networks. VEPA devices, which enable each switch front panel port to be virtualized, can add many more customer usable physical ports to a system. Consequently, computing resource utilization (e.g., CPU, memory, I/O) for a network infrastructure device will rise proportionally.

One significant contributor to CPU, memory, and I/O utilization on network infrastructure devices can be the processing required by STP. With STP, a network infrastructure device can be required to maintain protocol state information about every enabled VLAN on every port on the device. For example, the device may need to maintain such information to determine per VLAN and/or private VLAN (PVLAN) count. Hence, reducing overhead for STP wherever possible without affecting the operation of the protocol can be beneficial to both network operating system software stability and scalability.

One approach for optimizing STP operation is to control the STP type of the port. STP port type can include edge port or network port. Edge ports can be connected directly to hosts. Network ports can be connected to network infrastructure devices. Edge ports may not need the full STP state machine required by network ports. For example, each host-facing port in a network infrastructure device with a large number of edge ports can be set to STP edge mode, wherein the protocol operation can be pruned back and the port can be placed in a forwarding state without running through the entire protocol state machine. The periodic BPDUs transmitted during operation of STP may not be sent on edge ports, further reducing resource utilization on the system. In other embodiments, the periodic BPDUs transmitted during operation of STP may be extended: increasing the time between transmissions.

In certain conventional approaches, the ports of network infrastructure devices can be configured manually by a network administrator. However, with the deployment of high port density network infrastructure devices and VEPA appliances in data centers, the number of ports in the data centers has risen significantly. To the extent manual configuration of STP port type is feasible; manually configuring the port type can be inefficient and error-prone. Another conventional approach assumes that ports residing on VEPA appliances are likely to be connected to end hosts, and all ports on such devices can be configured as edge ports. In certain situations, however, ports on VEPA appliances can be connected to networking infrastructure devices such that a putative edge port may actually be attached to a device that is not an end host. This can cause loops in the network and result in network instability.

Systems and approaches in accordance with various embodiments may overcome one or more of the aforementioned and other deficiencies experienced in conventional approaches for operating STP by employing a mechanism wherein the STP port type (e.g., edge or network) can be dynamically configured based on a neighbor discovery trigger. In various embodiments, network infrastructure devices are configured to run a protocol for discovering network device capabilities, such as Link Level Discovery Protocol (LLDP) or Cisco Discovery Protocol (CDP), for example. For example, LLDP can be used by the network infrastructure devices to exchange system capabilities (e.g., System Capabilities TLV type is 7 in LLDP) to identify whether the link level peer is a host device or a network device. The system capability TLV exchange can serve as a trigger to configure the STP port as a network port for a port connected to a switch, bridge, relay, components thereof, among other network infrastructure devices (e.g., LLDP capability values 3, 9, 10, and/or 11), or an edge port for a port connected to an end host (e.g., LLDP capability value 8).

LLDP is standardized as IEEE 802.1AB, entitled "Station and Media Access Control Connectivity Discovery", and which is incorporated herein by reference. LLDP is a link layer protocol that allows an IEEE 802 LAN station to report the capabilities and current status of the system associated with a MAC service access point (MSAP). The MSAP can provide the MAC service to a logical link control (LLC) entity, and that LLC entity can provide a link service access point (LSAP) to an LLDP agent that transmits and receives information to and from the LLDP agents of other stations attached to the same LAN. The information can be distributed and received in each LLDP data unit (LLDPDU) and can be stored in one or more Management Information Bases (MIBs).

The information fields in each LLDP frame are contained in an LLDPDU as a sequence of variable length information elements, that each include "type," "length," and "value" fields (known as TLVs), where type identifies what kind of information is being sent, length indicates the length of the information string in octets, and value is the actual information that needs to be sent (for example, a binary bit map or an alphanumeric string that can contain one or more fields).

Figure 4:
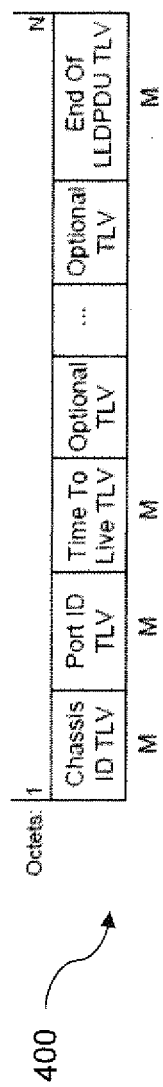
FIG. 4 illustrates a block diagram of a Link Level Discovery Protocol Data Unit (LLDPDU) in accordance with an exemplary embodiment.

Each LLDPDU can contain four mandatory TLVs, including a chassis ID TLV, port ID TLV, time to live (TTL) TLV, and end of LLDPU TLV. An LLDPU can also contain zero or more optional TLVs, as allowed by the maximum size of the LLDPU, and as selected by network management. FIG. 4 illustrates an example of an LLDPDU 400 that can be used in various embodiments. The chassis ID and the port ID values can be concatenated to form a logical MSAP identifier that is used by the recipient to identify the sending LLDP agent/port. Both the chassis ID and port ID values can be defined in a number of convenient forms. Once selected, however, the chassis ID/port ID value combination remains the same as long as the particular port remains operable.

A non-zero value in the TTL field of the TTL TLV can tell the receiving LLDP agent how long all information pertaining to this LLDPDU's MSAP identifier is valid so that all the associated information can later be automatically discarded by the receiving LLDP agent if the sender fails to update it in a timely manner. A zero value can indicate that any information pertaining to this LLDPDU's MSAP identifier is to be discarded immediately. The end of LLDPDU TLV can mark the end of the LLDPDU.

The maximum length of the LLDPDU is the maximum information field length allowed by the particular transmission rate and protocol. In IEEE 802.3 MACs, for example, the maximum LLDPDU length is the maximum data field length for the basic, untagged MAC frame (e.g., 1500 octets).

As mentioned, TLVs are generally grouped as mandatory TLVs and optional TLVs. Mandatory TLVs can be considered to be basic to the management of network stations and that are a required capability of all LLDP implementations.

Each TLV in this category can be identified by a unique TLV type value that indicates the particular kind of information contained in the TLV. Optional TLVs can include organizationally specific extension sets of TLVs that are defined by standards groups such as IEEE 802.1 and IEEE 802.3 and others to enhance management of network stations that are operating with particular media and/or protocols. TLVs in this category can be identified by a common TLV type value that indicates the TLV as belonging to the set of organizationally specific TLVs. Each organization can be identified by an organizationally unique identifier (OUI). Organizationally specific TLV subtype values can indicate the kind of information contained in the TLV.

Figure 5:
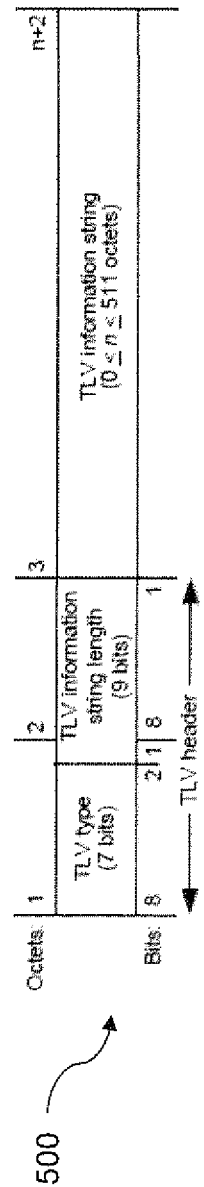
FIG. 5 illustrates a block diagram of a Type Length Value (TLV) field of an LLDPDU in accordance with an exemplary embodiment.

FIG. 5 illustrates a TLV field of an LLDPDU in accordance with an exemplary embodiment. The TLV field 500 can include a TLV type field that occupies the seven most significant bits of the first octet of the TLV format. The least significant bit in the first octet of the TLV format is the most significant bit of the TLV information string length field. Table 1 lists the currently defined TLVs, their identifying TLV type values, and whether they are mandatory or optional for inclusion in any particular LLDPDU.

TABLE 1

| TLV type | TLV name | Usage in LLDPDU |
| --- | --- | --- |
| 0 | End Of LLDPDU | Mandatory |
| 1 | Chassis ID | Mandatory |
| 2 | Port ID | Mandatory |
| 3 | Time To Live | Mandatory |
| 4 | Port Description | Optional |
| 5 | System Name | Optional |
| 6 | System Description | Optional |
| 7 | System Capabilities | Optional |
| 8 | Management Address | Optional |
| 9-126 | Reserved for future standardization | — |
| 127 | Organizationally Specific TLVs | Optional |

The TLV information string length field can contain the length of the information string, in octets. The TLV information string can be fixed or variable length, and can include one or more information fields with associated subtype identifiers and field length Designators. The information string can also contain either binary or alpha-numeric information that is instance specific for the particular TLV type and/or subtype.

Figure 6:
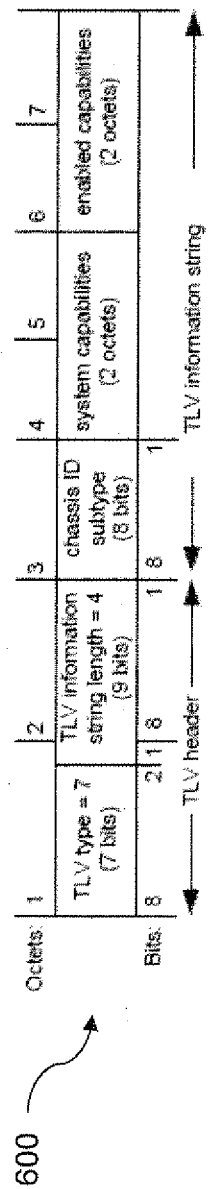
FIG. 6 illustrates a block diagram of a System Capabilities TLV of an LLDPDU in accordance with an exemplary embodiment.

The System Capabilities TLV, TLV type 7, can be an optional TLV that identifies the primary function(s) of the system and whether or not these primary functions are enabled. FIG. 6 illustrates an example of a System Capabilities TLV 600 that can be used in various embodiments.

The system capabilities field contains a bit-map of the capabilities that define the primary function(s) of the system. The bit positions for each function and the associated Management Information Base (MIB) or standard that may be supported are listed in Table 2.

TABLE 2

| Bit | Capability | Reference |
| --- | --- | --- |
| 1 | Other | — |
| 2 | Repeater | IETF RFC 2108 |
| 3 | MAC Bridge | IEEE Std 802.1D |
| 4 | WLAN Access Point | IEEE Std 802.11 MIB |
| 5 | Router | IETF RFC 1812 |
| 6 | Telephone | IETF RFC 4293 |

TABLE 2-continued

| Bit | Capability | Reference |
| --- | --- | --- |
| 7 | DOCSIS cable device | IETF RFC 4639 and IETF RFC 4546 |
| 8 | Station Only | IETF RFC 4293 |
| 9 | C-VLAN Component of a VLAN Bridge | IEEE Std 802.1Q |
| 10 | S-VLAN Component of a VLAN Bridge | IEEE Std 802.1Q |
| 11 | Two-port MAC Relay (TPMR) | IEEE Std 802.1Q |
| 12-16 | reserved | — |

A binary one in the associated bit indicates the existence of that capability. Individual systems may indicate more than one implemented functional capability (for example, both a bridge and router capability). As mentioned, the system capability TLV exchange can serve as a trigger to configure the STP port type as a network port for bridges, switches, relays, among other infrastructure devices (e.g., LLDP capability values 3, 9, 10, and/or 11), or an edge port for end hosts (e.g., LLDP capability value 8).

In various embodiments, the LLDP operation can be enabled on all devices of a network. Further, LLDP running on the devices of the network can be configured to support the System Capabilities TLV since the capability TLV exchange is optional.

While STP port type setting is one of the parameters available to control STP behavior on a port, further optimization can also be implemented. For example, STP implementation for the Cisco® Nexus 2000 HIF significantly reduces the number of BPDU packets that are sent on a link after the port transitions to forwarding. That is, once the configuration trigger is available, more optimizations can be done on the basis of the capabilities of the link level peer. In addition, a STP port that is placed in forwarding mode, can be placed in portfast mode which causes the port to enter the forwarding state almost immediately. By using portfast mode, the port can reduce the time of listening and learning states which can allow a server or workstation to come online faster.

Moreover, when setting a port in a blocking state, the port can be set to block all traffic. However, in some embodiments, the port can be set to a blocking mode with one or more exemptions for certain types of traffic. For example, a port can be set to block all traffic but allow STP traffic and/or LLDP traffic. This way, the port can become aware if a change is made in the network such that the port should be set from one port type to another.

In various embodiments, every type of port is supported rather than just ports hosted on a VEPA device. In some embodiments, no assumption is made about the attached device. In this manner, loops can be prevented so long as the LLDP stack implementing system capability TLV exchange is enabled on all data center devices.

Figure 7:
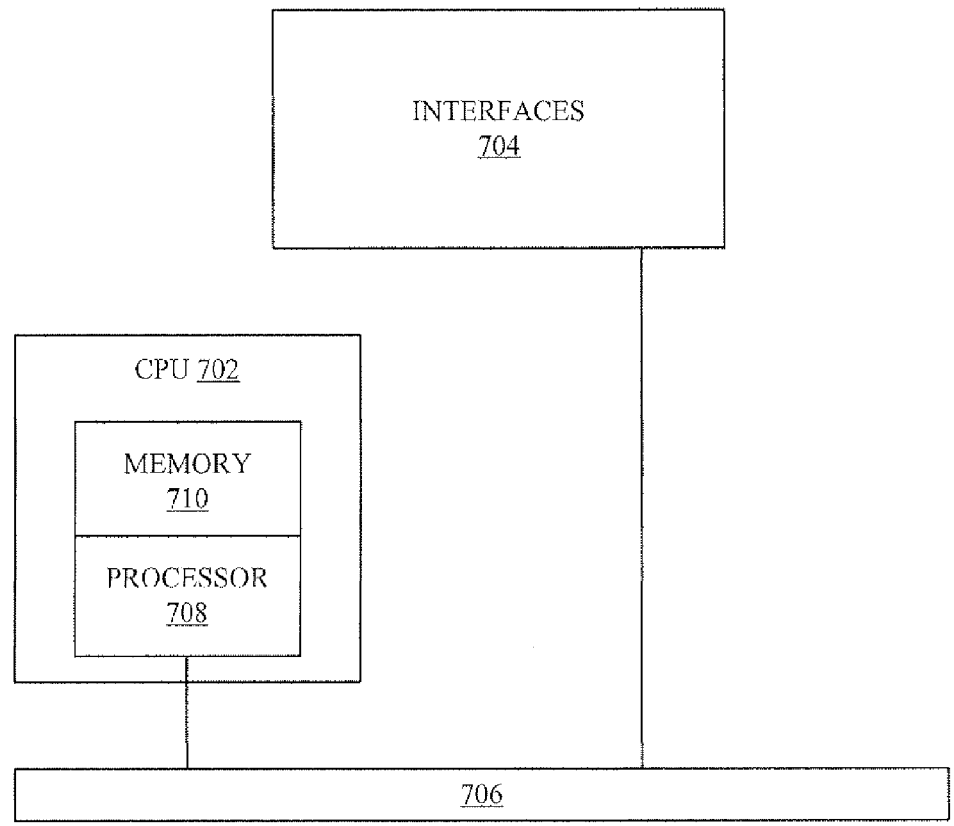
FIG. 7 illustrates a network device in accordance with an exemplary embodiment.

Referring to FIG. 7, a network device suitable for implementing the STP optimization technique in accordance with an exemplary embodiment is illustrated. The network device 700 can include a master central processing unit (CPU) 702, interfaces 704, and a bus 706 (e.g., a PCI bus). When acting under the control of appropriate software or firmware, the CPU 702 can be responsible for operating STP. It preferably accomplishes all these functions under the control of software including an operating system and any appropriate applications software. CPU 702 may include one or more processors 708 such as a processor from the Motorola family of microprocessors or the MIPS family of microprocessors. In an alternative embodiment, processor 708 can be specially designed hardware for controlling the operations of network device 700. In a specific embodiment, a memory 710 (such as non-volatile RAM and/or ROM) also forms part of CPU 702. However, there are many different ways in which memory could be coupled to the system.

The interfaces 704 are typically provided as interface cards (sometimes referred to as "line cards"). Generally, they control the sending and receiving of data packets over the network and sometimes support other peripherals used with the network device 700. Among the interfaces that may be provided are Ethernet interfaces, frame relay interfaces, cable interfaces, DSL interfaces, token ring interfaces, and the like. In addition, various very high-speed interfaces may be provided such as fast token ring interfaces, wireless interfaces, Ethernet interfaces, Gigabit Ethernet interfaces, ATM interfaces, HSSI interfaces, POS interfaces, FDDI interfaces and the like. Generally, these interfaces can include ports appropriate for communication with the appropriate media. In some cases, they may also include an independent processor and, in some instances, volatile RAM. The independent processors may control such communications intensive tasks as packet switching, media control and management. By providing separate processors for the communications intensive tasks, these interfaces allow the master microprocessor 702 to efficiently perform routing computations, network diagnostics, security functions, etc.

Although the system shown in FIG. 7 is one specific network device of the present invention, it is by no means the only network device architecture on which the present invention can be implemented. For example, an architecture having a single processor that handles communications as well as routing computations, etc. is often used. Further, other types of interfaces and media could also be used with the network device.

Regardless of the network device's configuration, it may employ one or more memories or memory modules (including memory 710) configured to store program instructions for the general-purpose network operations and mechanisms for roaming, route optimization and routing functions described herein. The program instructions may control the operation of an operating system and/or one or more applications, for example. The memory or memories may also be configured to store tables such as mobility binding, registration, and association tables, etc.

Referring to FIG. 8A, a block diagram of a network device in accordance with an exemplary embodiment is illustrated. A more appropriate embodiment will be apparent to those of ordinary skill in the art when practicing the present technology. Persons of ordinary skill in the art will also readily appreciate that other system embodiments are possible. FIG. 8A illustrates a conventional system bus computing system architecture 800 wherein the components of the system are in electrical communication with each other using a bus 805. Exemplary system 800 includes a processing unit (CPU or processor) 810 and a system bus 805 that couples various system components including the system memory 815, such as read only memory (ROM) 820 and random access memory (RAM) 825, to the processor 810. The system 800 can include a cache of high-speed memory connected directly with, in close proximity to, or integrated as part of the processor 810. The system 800 can copy data from the memory 815 and/or the storage device 830 to the cache 812 for quick access by the processor 810. In this way, the cache can provide a performance boost that avoids processor 810 delays while waiting for data. These and other modules can control or be configured to control the processor 810 to perform various actions. Other system memory 815 may be available for use as well. The memory 815 can include multiple different types of memory with different performance characteristics. The processor 810 can include any general purpose processor and a hardware module or software module, such as a first module 832, a second module 834, and a third module 836 stored in storage device 830, configured to control the processor 810 as well as a special-purpose processor where software instructions are incorporated into the actual processor design. The processor 810 may essentially be a completely self-contained computing system, containing multiple cores or processors, a bus, memory controller, cache, etc. A multi-core processor may be symmetric or asymmetric.

The communications interface 840 can generally govern and manage the user input and system output. There is no restriction on operating on any particular hardware arrangement and therefore the basic features here may easily be substituted for improved hardware or firmware arrangements as they are developed.

Storage device 830 is a non-volatile memory and can be a hard disk or other types of computer readable media which can store data that are accessible by a computer, such as magnetic cassettes, flash memory cards, solid state memory devices, digital versatile disks, cartridges, random access memories (RAMs) 825, read only memory (ROM) 820, and hybrids thereof.

The storage device 830 can include software modules 832, 834, 836 for controlling the processor 810. Other hardware or software modules are contemplated. The storage device 830 can be connected to the system bus 805. In one aspect, a hardware module that performs a particular function can include the software component stored in a computer-readable medium in connection with the necessary hardware components, such as the processor 810, bus 805, display 835, and so forth, to carry out the function.

Referring to FIG. 8B, a block diagram of a computer system having a chipset architecture that can be used in executing the described method and generating and displaying a graphical user interface (GUI). The computer system 850 is an example of computer hardware, software, and firmware that can be used to implement the disclosed technology. The computer system 850 can include a processor 855, representative of any number of physically and/or logically distinct resources capable of executing software, firmware, and hardware configured to perform identified computations. The processor 855 can communicate with a chipset 860 that can control input to and output from the processor 855. In this example, the chipset 860 outputs information to output 865, such as a display, and can read and write information to a storage device 870, which can include magnetic media, and solid state media, for example. The chipset 860 can also read data from and write data to RAM 875. A bridge 880 for interfacing with a variety of user interface components 885 can be provided for interfacing with the chipset 860. Such user interface components 885 can include a keyboard, a microphone, touch detection and processing circuitry, a pointing device, such as a mouse, and so on. In general, inputs to the computer system 850 can come from any of a variety of sources, machine generated and/or human generated.

The chipset 860 can also interface with one or more communication interfaces 290 that can have different physical interfaces. Such communication interfaces can include interfaces for wired and wireless local area networks, for broadband wireless networks, as well as personal area networks. Some applications of the methods for generating, displaying, and using the GUI disclosed herein can include receiving ordered datasets over the physical interface or be generated by the machine itself by the processor 855 analyzing data stored in storage 870 or 875. Further, the machine can receive inputs from a user via user interface components 885 and execute appropriate functions, such as browsing functions by interpreting these inputs using the processor 855.

It can be appreciated that exemplary systems 800 and 850 can have more than one processor 810 or be part of a group or cluster of computing devices networked together to provide greater processing capability.

Referring to FIG. 9, a flowchart for executing an optimized STP configuration in accordance with an exemplary embodiment is illustrated. The exemplary method 900 is provided by way of example, as there are a variety of ways to carry out the method. The method 900 described below can be carried out using the configurations illustrated in FIGS. 1, 8A and 8B by way of example, and various elements of these figures are referenced in explaining exemplary method 900. Each block shown in FIG. 9 represents one or more processes, methods or subroutines, carried out in the exemplary method 900. The exemplary method 900 can begin at block 902.

At block 902, system capabilities information from a link lever peer is received. For example, a network infrastructure device 700, 800 can receive system capabilities information from a link level peer that is a direct neighbor. The information can be received via a port of the network infrastructure device 700, 800. The system capability information can be received via a protocol for discovering network device capabilities, such as LLDP. In order for a device to provide the system capability information via LLDP, the LLDP operation and TLV exchange needs to be activated on each device in the network. For example, an operator can enable the LLSP operation and TLV exchange when each device in the network when each device is installed. After receiving system capabilities information, the method 900 can proceed to block 904.

At block 904, a device type of link level peer is determined. For example, a network infrastructure device 700, 800 can determine the device type of the link level peer based on the received system capabilities information from the link level peer. For example, using the system capabilities information shown in Table 2, the network infrastructure device 700, 800 can determine if the neighbor device is a network port (e.g., LLDP capability values 3, 9, 10, and/or 11) or an edge port for end hosts (e.g., LLDP capability value 8). After determining the device type, the method 900 can proceed to block 906.

At block 906, a STP port type is configured for the port based on the determined device type. For example, a network infrastructure device 700, 800 can configure the STP port type of the port based on the determined device type. For example, the STP port type can be set to a network port if the device type is one of, a Media Access Control (MAC) bridge, a Customer Virtual Local Area Network (C-VLAN) component of a VLAN bridge, a Service VLAN (S-VLAN) of a VLAN Bridge, or a Two-port MAC Relay (TPMR). The STP port can be set to an edge port based on the determined type being an end station. For ports that are configured as edge ports, the edge ports can be placed in a forwarding state or a portfast state without running through the entire STP state machine. In addition, the periodic BDPUs can be reduced and/or eliminated to reduce the resource utilization on the system.

For clarity of explanation, in some instances the present technology may be presented as including individual functional blocks including functional blocks comprising devices, device components, steps or routines in a method embodied in software, or combinations of hardware and software.

In some embodiments the computer-readable storage devices, mediums, and memories can include a cable or wireless signal containing a bit stream and the like. However, when mentioned, non-transitory computer-readable storage media expressly exclude media such as energy, carrier signals, electromagnetic waves, and signals per se.

Methods according to the above-described examples can be implemented using computer-executable instructions that are stored or otherwise available from computer readable media. Such instructions can comprise, for example, instructions and data which cause or otherwise configure a general purpose computer, special purpose computer, or special purpose processing device to perform a certain function or group of functions. Portions of computer resources used can be accessible over a network. The computer executable instructions may be, for example, binaries, intermediate format instructions such as assembly language, firmware, or source code. Examples of computer-readable media that may be used to store instructions, information used, and/or information created during methods according to described examples include magnetic or optical disks, flash memory, USB devices provided with non-volatile memory, networked storage devices, and so on.

Devices implementing methods according to these disclosures can comprise hardware, firmware and/or software, and can take any of a variety of form factors. Typical examples of such form factors include laptops, smart phones, small form factor personal computers, personal digital assistants, and so on. Functionality described herein also can be embodied in peripherals or add-in cards. Such functionality can also be implemented on a circuit board among different chips or different processes executing in a single device, by way of further example.

The instructions, media for conveying such instructions, computing resources for executing them, and other structures for supporting such computing resources are means for providing the functions described in these disclosures.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims.

What is claimed is:

1. A computer-implemented method comprising:
receiving, at a network infrastructure device, system capabilities information from a network peer of the network infrastructure device;
determining, at the network infrastructure device, a device type of the network peer based on the system capabilities information; and automatically configuring, a Spanning Tree Protocol (STP) port type for the port to a network port in response to determining that the device type of the network peer comprises one of a Media Access Control (MAC) bridge, a Customer Virtual Local Area Network (C-VLAN) component of a VLAN bridge, Service VLAN (S-VLAN) component of the VLAN bridge, or a Two-port MAC relay (TPMR).

2. The computer-implemented method of claim 1, wherein the network peer is a link level peer of the network infrastructure device.

3. The computer-implemented method of claim 1, wherein the system capabilities information identifies whether the network peer is a host or a network infrastructure device.

4. The computer implemented method of claim 1, wherein the system capabilities information is received via a Link Level Discovery Protocol (LLDP).

5. The computer-implemented method of claim 1, wherein configuring the STP port type for the port includes: setting the STP port type for the port to an edge port in response to determining that the device type of the network peer is an end station.

6. The computer-implemented method of claim 5, wherein setting the STP port type for the port to an edge port further comprises setting the port to a forwarding state.

7. A network infrastructure device comprising:
one or more processors; and
a computer-readable storage medium coupled to the processors, and having stored therein instructions which, when executed by the processors, cause the processors to perform operations comprising:
receiving system capabilities information from a network peer;
determining a device type of the network peer based on the system capabilities information; and
automatically configuring, a Spanning Tree Protocol (STP) port type for the port to a network port in response to determining that the device type of the network peer comprises one of a Media Access Control (MAC) bridge, a Customer Virtual Local Area Network (C-VLAN) component of a VLAN bridge, Service VLAN (S-VLAN) component of the VLAN bridge, or a Two-port MAC relay (TPMR).

8. The network infrastructure device of claim 7, wherein the network peer is a link level peer of the network infrastructure device.

9. The network infrastructure device of claim 7, wherein the system capabilities information identifies whether the network peer is a host or a network infrastructure device.

10. The network infrastructure device of claim 7, wherein the system capabilities information is received via a Link Level Discovery Protocol (LLDP).

11. The network infrastructure device of claim 7, wherein configuring the STP port type for the port includes:
setting the STP port type for the port to an edge port in response to determining that the device type of the network peer is an end station.

12. The network infrastructure device of claim 11, wherein setting the STP port type for the port to an edge port further comprises setting the port to a forwarding state.

13. A non-transitory computer-readable storage medium having stored therein instructions which, when executed by a processor, cause the processor to perform operations comprising:
receiving, at a network infrastructure device, system capabilities information from a network peer of the network infrastructure device;
determining, at the network infrastructure device, a device type of the network peer based on the system capabilities information; and
automatically configuring, a Spanning Tree Protocol (STP) port type for the port to a network port in response to determining that the device type of the network peer comprises one of a Media Access Control (MAC) bridge, a Customer Virtual Local Area Network (C-VLAN) component of a VLAN bridge, Service VLAN (S-VLAN) component of the VLAN bridge, or a Two-port MAC relay (TPMR).

14. The non-transitory computer-readable storage medium of claim 13, wherein the network peer is a link level peer of the network infrastructure device.

15. The non-transitory computer-readable storage medium of claim 13, wherein the system capabilities information identifies whether the network peer is a host or a network infrastructure device.

16. The non-transitory computer-readable storage medium of claim 13, wherein the system capabilities information is received via a Link Level Discovery Protocol (LLDP).

* * * * *